United States Patent [19]

Venkateswaran

[11] Patent Number: 4,485,459
[45] Date of Patent: Nov. 27, 1984

[54] REDUNDANT COLUMNS FOR BYTE WIDE MEMORIES

[75] Inventor: Kalyanasundaram Venkateswaran, San Jose, Calif.

[73] Assignee: Fairchild Camera & Instrument Corp., Mountain View, Calif.

[21] Appl. No.: 420,200

[22] Filed: Sep. 20, 1982

[51] Int. Cl.³ .............................................. G11C 8/00
[52] U.S. Cl. ...................................... 365/200; 365/63
[58] Field of Search ........................... 365/200, 96, 63

[56] References Cited

U.S. PATENT DOCUMENTS 4,228,528  10/1980  Cenker et al. ...................... 365/200

FOREIGN PATENT DOCUMENTS 2263019  7/1973  Fed. Rep. of Germany ...... 365/200

Primary Examiner—James W. Moffitt
Attorney, Agent, or Firm—Kenneth Olsen; Ronald Craig Fish; Carl L. Silverman

[57] ABSTRACT

Apparatus is provided for substituting a spare column of memory cells in a byte wide memory for a defective column of cells in such memory. The apparatus includes a spare column of memory cells, an electrically conductive line 13, a spare decoder 16 for switchably connecting the line 13 to the spare column, a first fuse $FSD_1$ between the spare column and the line 13, a series of second fuses FS controlling a series of switches $T_1$, $T_2$ ... between the line 13 and corresponding sense amplifiers 11, and a series of third fuses FD, each connected between a corresponding column and the sense amplifier associated with that column. The spare column of memory cells is connected to the appropriate sense amplifier by blowing the appropriate fuse FS and supplying the necessary address information to spare decoder 16. The defective column of memory cells may be disconnected by blowing the appropriate fuse FD.

12 Claims, 1 Drawing Figure

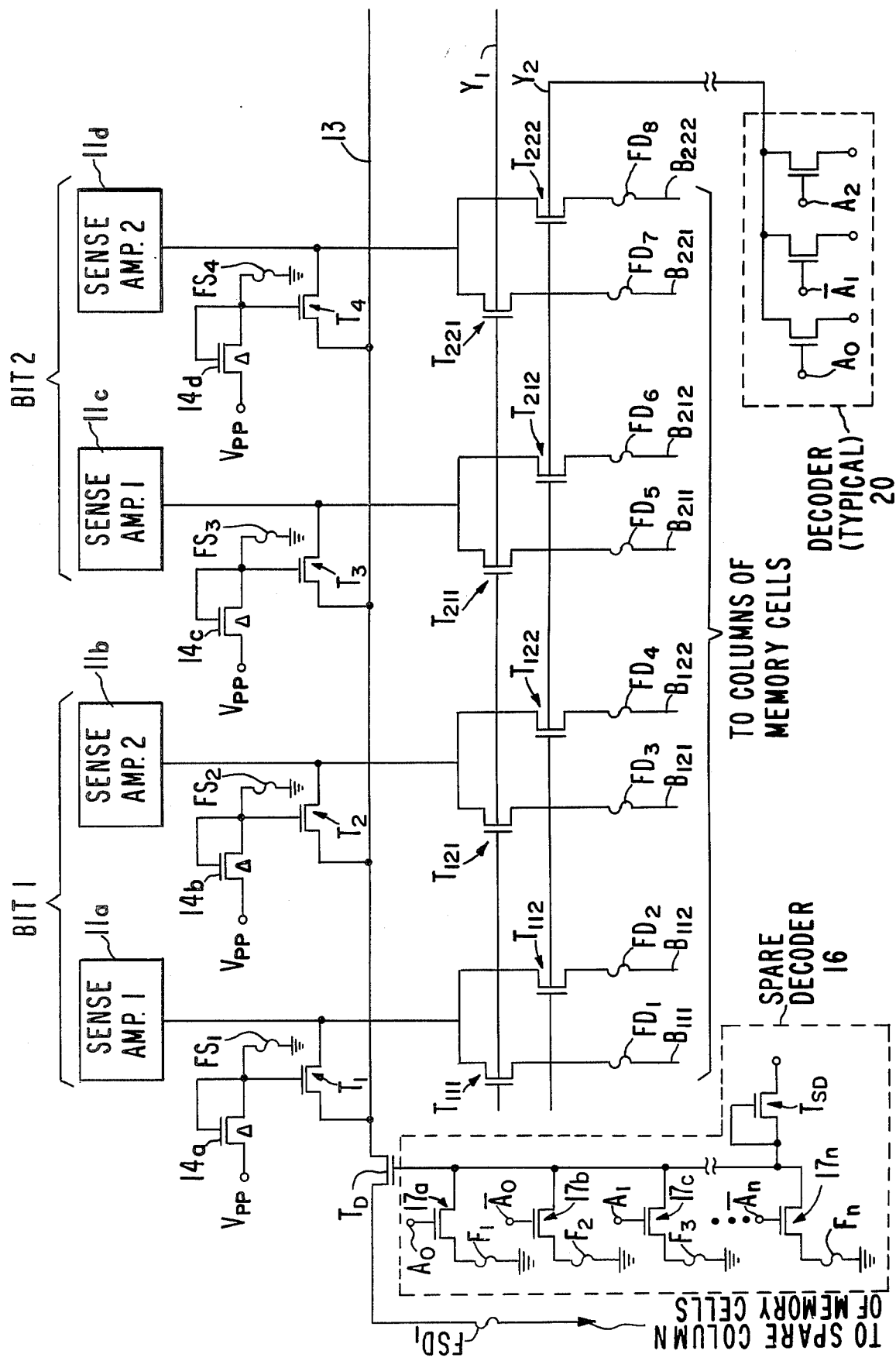

REDUNDANT COLUMNS FOR BYTE WIDE MEMORIES

BACKGROUND OF THE INVENTION

1. Field of the Invention

This invention relates to integrated circuit memories, and, in particular, to an integrated circuit memory having spare columns of memory cells which may be selectively connected to replace defective columns in the memory.

2. Description of the Prior Art

In integrated circuit memories, a single defect in any portion of the array of memory cells may render the entire memory useless. As improvements in the design and fabrication of integrated circuits are made, greater numbers of memory cells are being placed on a single chip. Furthermore, generally physically larger integrated circuits are being manufactured. Each factor tends to increase the likelihood of a defect in one or more cells which may render an entire chip useless.

One prior art solution to this problem has been to design and fabricate integrated circuit memories using more fault tolerant designs and processes. This approach, by itself, does not always suffice. Consequently, another solution which has received increasing attention is the fabrication of redundant components on the same chip. At a suitable stage in the fabrication process, the non-functional portions of the circuit are replaced with the redundant portions, typically by using redundant wiring techniques, fuses, discretionary metal masks, or other techniques. The usual prior art approach, however, has been to replace an entire relatively large block in the memory with a new block. For example, in a 64k memory divided into 16 sections, each of 4k bits, a defective bit in a single section will result in the replacement of the entire 4k section. Unfortunately, this approach requires a considerable amount of extra logic and extra space on the integrated circuit.

SUMMARY OF THE INVENTION

This invention provides a technique by which defective columns in a byte wide memory may be replaced with spare functional columns. These spare columns may be used to replace any column associated with any one of the sense amplifiers in any one of the bits of the memory. The invention requires very little extra power, and imposes minimal or no speed penalty.

In the preferred embodiment apparatus for providing a spare column of memory cells in a byte wide memory wherein each byte includes n bits, each bit has associated therewith m sense amplifiers, and each sense amplifier has associated with it p columns of memory cells, which apparatus includes: a spare column of memory cells, an electrically conductive line, a decoder for switchably connecting the line to the spare column, a first fusable connection between the spare column and the line, m second fusable connections, each between the line and a corresponding one of the m sense amplifiers, and p third fusable connections, each connected between a corresponding one of the p columns and a sense amplifier associated with that column. To replace a defective column with a spare or redundant column, the second fusable connection associated with the sense amplifier for the defective column is blown to enable connection of the spare column to the appropriate sense amplifier when the decoder is properly addressed. The third fusable connection between the defective column and the sense amplifier associated with it is also blown to disconnect the defective column from the sense amplifier. An appropriate address is then programmed into the decoder by blowing appropriate fuses in the decoder. In this manner, the defective column is disconnected from its sense amplifier, and the spare column connected in its place. Of course, as many spare columns of memory cells may be provided as desired. Additionally, in the preferred embodiment, each of the second fusable connections includes a switching transistor connected between the electrically conductive line and the sense amplifier, and a fuse connected between a first potential source and the switching transistor to control the switching transistor.

BRIEF DESCRIPTION OF THE DRAWING

The FIGURE is a schematic drawing illustrating the preferred embodiment of this invention when applied to a byte wide memory.

DETAILED DESCRIPTION OF THE PREFERRED EMBODIMENT

The FIGURE illustrates the preferred embodiment of this invention. For illustration, the memory shown in the FIGURE includes two bits (designated Bit 1 and Bit 2), although as many bits as desired may be used. Each of these bits has associated with it a pair of sense amplifiers 11. Each sense amplifier is connected to one or more columns of memory cells. For example, sense amplifier 11b is connected to columns $B_{121}$ and $B_{122}$. This organization is typical of many memories. For example, in an eight bit wide 64k memory, there will be bits one through eight, with each bit having four sense amplifiers and each sense amplifier having eight columns. Each column will include 256 memory cells.

In a byte wide memory, a bit may be retrieved by first addressing the row (not shown) in which it resides, and then selecting one of the appropriate columns by using lines such as $Y_1$ and $Y_2$, etc., as shown. In this manner, for an 8 bit per byte memory and eight-bit byte of information will be presented in the sense amplifiers associated with the eight addressed columns. The particular columns selected are determined by the decoders associated with each of the Y lines used to select the columns. A typical decoder 20 is shown in the FIGURE. Decoder 20 is connected to receive address inputs $A_0$, $A_1$ and $A_2$. The transistors activated by the $Y_2$ line, i.e., $T_{112}$, $T_{122}$, $T_{212}$, and $T_{222}$, connect each sense amplifier 11a–d with the second column $B_{112}$, $B_{122}$, $B_{212}$, or $B_{222}$ of the set of columns connected to each sense amplifier. When the address $A_0$, $\overline{A_1}$, and $A_2$ are pulled low line $V_2$ is turned on thereby connecting the columns $B_{112}$, $B_{122}$, $B_{212}$, and $B_{222}$ with their respective sense amplifiers 11a–d. Line $Y_1$ is connected to second typical decoder (not shown) having a different address code than the $Y_1$ decoder 20. Thus, line $Y_1$ is turned off when line $Y_2$ is turned on so that each sense amplifier is connected to only one column at a given time.

The remaining circuitry shown in the FIGURE is used to provide the spare column of memory cells of this invention. As shown, a conducting line 13 is coupled through a transistor $T_D$ and a fuse $FSD_1$ to the spare column of memory cells. Fuse $FSD_1$ allows disconnecting the spare column of memory cells if it is found defective once replaced. The spare column of memory cells is designed and constructed in a manner identical to the regular columns of memory cells. A transistor $T_1$, $T_2$, etc. is connected between each sense amplifier 11 and line 13. For example, transistor $T_2$ has its source and drain connected between line 13 and sense amplifier 11b. The conductance of each such transistor is controlled by the circuit connected to its gate. Each such circuit includes a selecting fuse $FS_1$, $FS_2$, etc., and a depletion mode transistor 14a, 14b, etc. For example, as shown in conjunction with sense amplifier 11c, the gate of transistor 14c is connected to the gate of transistor $T_3$ and through fuse $FS_3$ to ground.

The conductance of transistor $T_D$ is controlled by the spare decoder 16 connected to its gate. As shown, spare decoder 16 includes a plurality of transistors 17a, 17b, . . . 17n, the gates of which are connected to address inputs $A_0$, $\overline{A}_0$, $A_1$, $\overline{A}_1$, etc. The source and drain of each transistor 17 are connected between a corresponding fuse $F_1$, $F_2$, $F_3$, . . . $F_n$ and the gate of transistor $T_D$.

The operation of the circuit shown, if it desired to replace a defective column, is as follows. Assume that column $B_{212}$ is defective. Column $B_{212}$ is the column associated with bit 2, sense amplifier 1, and column 2. To disconnect this column, fuse $FD_6$ is blown. In the preferred embodiment, each of the fuses shown is constructed in a manner which enables it to be blown using a laser. Such fuses are well known, and are described, for example, in "Cost-Effective Yield Improvement in Fault-Tolerant VLSI Memory", by J. F. M. Bindels, 1981 *Digest of Technical Papers of International Solid State Circuits Conference.*

Fuse $FS_3$ is also blown to disconnect the gate of transistor $T_3$ from ground, and couple sense amplifier 11c to line 13 through transistor $T_3$. Because line 13 is coupled through transistor $T_D$ and fuse $FSD_1$ to the spare column of memory cells, the spare column of memory cells is now connected to sense amplifier 11c whenever transistor $T_D$ is turned on.

Transistor $T_D$ is controlled by spare decoder 16, and by blowing appropriate fuses at $F_1$, $F_2$. . . $F_n$, the address information supplied on terminals $A_0$, $\overline{A}_0$, $A_1$ . . . will turn on transistor $T_D$ at the same time column $B_{212}$ is selected by the decoder connected to line $Y_2$. For example, if the address which selects line $Y_2$ is as shown in the typical decoder 20, then all of the fuses $F_1$ . . . $F_n$ will be blown except the fuses associated with address inputs $A_0$, $\overline{A}_1$, and $A_1$. Thus, the transistor $T_D$ will be turned on whenever transistor $T_{212}$ would have been turned on by the decoder 20. In this manner, the spare column of memory cells is effectively connected in place of the assumed defective column $B_{212}$.

The invention therefore enables efficient use of redundant column elements in a byte wide memory without consuming substantial extra space on the chip or requiring extra logic. The redundant columns require minimal extra power, result in minimal or no speed penalty, and do not interfere with the operation of the normal columns. The technique allows replacement of as many defective columns as desired up to the number of spare columns provided, and, in addition to random access memories, may be utilized in programable read only memories and erasable memories.

Although the embodiment of the invention has been described above, this embodiment is intended to illustrate the invention. The scope of the invention may be determined from the appended claims.

I claim:

1. Apparatus for providing a spare column of memory cells in a byte wide memory wherein each byte includes n bits, each bit includes m sense amplifiers, and each sense amplifier has associated with it p columns of memory cells, the apparatus comprising:
   a spare column of memory cells;
   an electrically conductive line;
   decoder means for switchably connecting the line to the spare column;
   a first fusable connection between the spare column and the line;
   m second fusable connections, each for selectively connecting the line and a corresponding one of the m sense amplifiers; and
   p third fusable connections, each connected between a corresponding one of the p columns and the sense amplifier associated with that column.

2. Apparatus as in claim 1 wherein each of the m second fusable connections comprises:
   switching means for connecting the line and the sense amplifier; and
   a fuse connected between a first potential source and the switching means to control the switching means.

3. Apparatus as in claim 2 wherein the switching means comprises a first transistor.

4. Apparatus as in claim 3 wherein the gate of the first transistor is connected to the fuse.

5. Apparatus as in claim 4 wherein the switching means further comprises a second transistor.

6. Apparatus as in claim 5 wherein the second transistor is coupled between a second potential source and the gate of the first transistor.

7. Apparatus as in claim 1 wherein each of the first, second, and third fusable connections comprises a laser destructible fuse.

8. Apparatus as in claim 1 wherein the decoder means comprises:
   a switching device connected between the first fusable connection and the line; and
   means for controlling the switching device.

9. Apparatus as in claim 8 wherein the switching device comprises a transistor.

10. Apparatus as in claim 8 wherein the means for controlling comprises:
    a plurality of transistors, each connected to the switching device;
    a plurality of fusable connections, each connected between a corresponding one of the plurality of transistors and a potential source.

11. Apparatus as in claim 10 wherein address information is supplied to each of the plurality of transistors connected to the switching device.

12. Apparatus as in claim 1 wherein each of the memory cells comprises a semiconductor memory cell.

* * * * *